United States Patent
Wu

(10) Patent No.: US 6,261,880 B1
(45) Date of Patent: Jul. 17, 2001

(54) PROCESS FOR MANUFACTURING THIN FILM TRANSISTORS

(75) Inventor: Biing-Seng Wu, Jen Te (TW)

(73) Assignee: Chi Mei Electronics Corp (TW)

( * ) Notice: Subject to any disclaimer, the term of this patent is extended or adjusted under 35 U.S.C. 154(b) by 0 days.

(21) Appl. No.: 09/317,134

(22) Filed: May 24, 1999

(51) Int. Cl.$^7$ .................................................. A01L 21/336
(52) U.S. Cl. ............................................ 438/159; 438/158
(58) Field of Search ................................... 438/158, 159, 438/FOR 200

(56) References Cited

U.S. PATENT DOCUMENTS

| | | |
|---|---|---|
| 5,721,164 | * 2/1998 | Wu . |
| 5,811,325 | * 9/1998 | Lin et al. . |
| 5,824,572 | * 10/1998 | Fukui et al. . |
| 6,018,166 | * 1/2000 | Lin et al. . |
| 6,140,668 | * 10/2000 | Mei et al. . |
| 6,156,583 | * 12/2000 | Hwang . |

FOREIGN PATENT DOCUMENTS

4344897 * 7/1994 (DE) .

* cited by examiner

*Primary Examiner*—George Fourson
*Assistant Examiner*—Joannie Adelle Garcia

(57) ABSTRACT

A method for forming a TFT device comprises the following steps. First, a first metal layer, a first insulating layer, a active layer and a contact layer are formed on the substrate in sequence. Next, a first photomask is used to define the contact layer, the active layer, the first insulating layer, and the first metal layer. Then, a second insulating layer and a transparent conducting layer are formed on the contact layer and the substrate in sequence. A second photomask is used to define the second insulating layer and the transparent conducting layer to expose a surface of the contact layer. A second metal layer is formed on the transparent conducting layer and contact layer. A third photomask is used to define the second metal layer to form the S/D structures. Then, the S/D structures are used to serve as a mask for etching the contact layer. Then, a passivation layer is formed on the second metal layer, the transparent conducting layer and the substrate, and a four photomask is used to define the passivation layer.

14 Claims, 4 Drawing Sheets

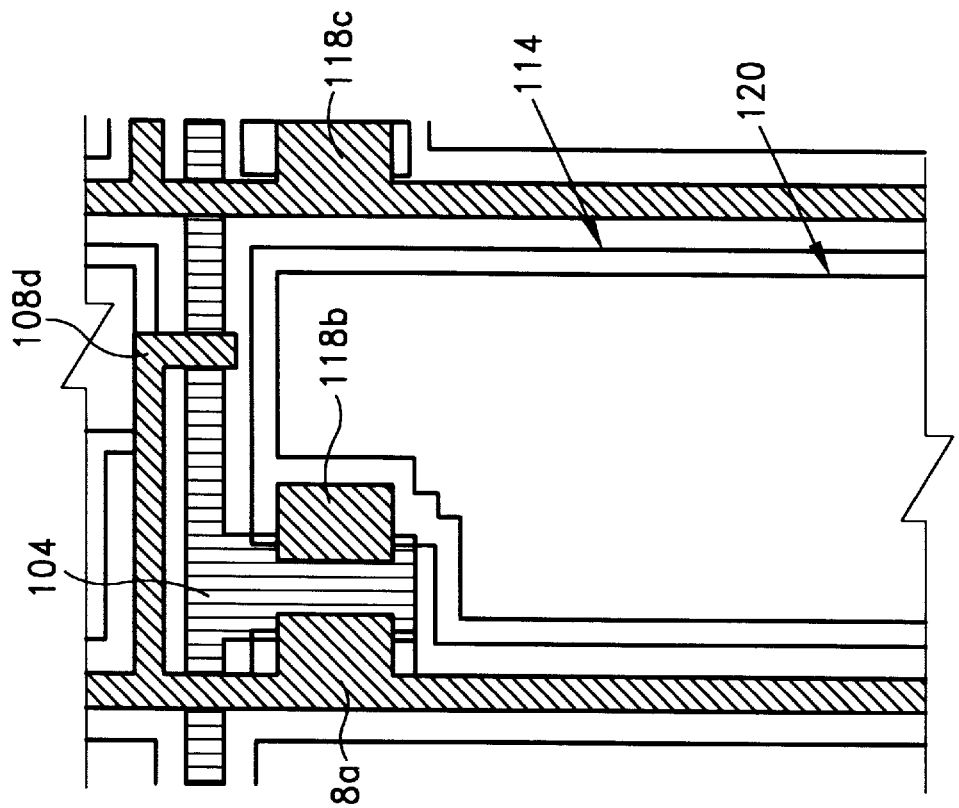
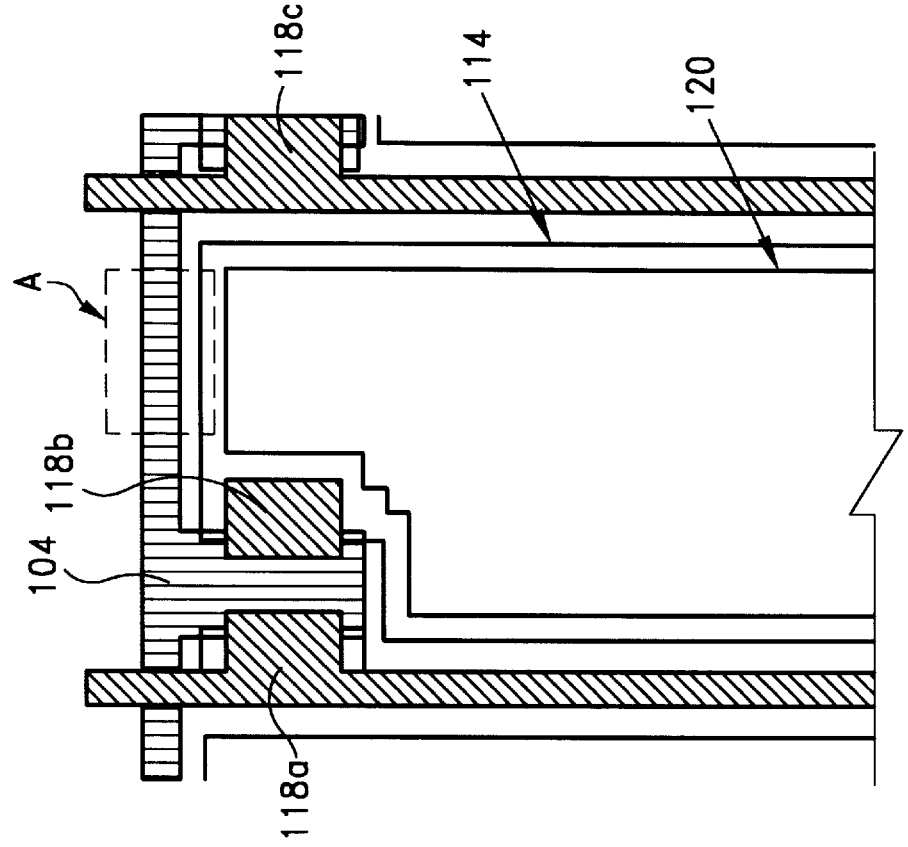

PROCESS FOR MANUFACTURING THIN FILM TRANSISTORS

FIELD OF THE INVENTION

The present invention relates to a process for manufacturing thin film transistors and, more specifically, to a process for manufacturing thin film transistors by using four photomasks.

BACKGROUND OF THE INVENTION

The liquid crystal displays (LCD) are widely applied in electrical products, such as digital watches, calculator, etc. for a long time. Moreover, with the advance of techniques for manufacture and design, the thin film transistors-liquid crystal display (TFT-LCD) is introduced into the portable computers, personal digital assistants, color televisions, and replaced gradually the kinescopes that are used for conventional displays. However, following the design rules of TFT-LCD tend to large scale, there are a lot of problems and challenges, such as low yields and low throughput, in manufacturing and developing TFT-LCD apparatus.

In general, the TFT-LCD comprises a bottom plate on which formed with thin film transistors and pixel electrodes, and a top plate on which constructed with color filters. The liquid crystal molecules are filled between the top plate and the bottom plate. In the operation, a signal voltage is applied to the TFT that is the switching element of each unit pixel. The TFT receives the signal voltage, it turns on so that data voltage carrying image information can be applied to the corresponding pixel electrode and the liquid crystal via the TFT. When the data voltage is applied to the TFT, the arrangement of the liquid crystal molecules is changed, thereby changing the optical properties and displaying the image.

There is a requirement to reduce the photolithography processes in manufacturing TFT devices for decreasing the process cycle time and cost at all times. Namely, it is better to reduce the number of the photomasks used in forming the TFT devices. According to the prior art of manufacturing inverted gate TFTs device for a TFT-LCD, six or more photomasks are needed. As shown in FIG. 1, a first metal layer is defined to serve as the gate structure 24, and an insulating layer 28 is formed on the substrate 22 to cover the gate structure 24. An a-silicon layer 30 is formed above the insulating layer 28 and the gate structure 24. An n+ a-silicon layer 32 is formed above the a-silicon layer 30. Then, an ITO layer 34 is deposited on the insulating layer 28 to form the pixel electrode 26 and connect to the S/D structures formed in latter steps. Then, the S/D structures 38 are formed on the n+ a-silicon layer 32 by patterning the second metal layer, the connection structure 40 are formed on insulating layer 28 and filled into the contact hole 36 simultaneously. Moreover, a passivation layer 42 is formed on the substrate 22 to cover the S/D structures 38 and the a-silicon layer 32.

It is noted that the TFT device as illustrated in FIG. 1 is manufactured by using six photomasks. Wherein the first photomask is used to define the gate structure 24, the second photomask is used to define the a-silicon layer 30 and n+ a-silicon layer 32, the third photomask is used to define the pattern of the ITO layer 34, the fourth photomask is used to define the contact hole 36 on the insulating layer 28, the fifth photomask is used to define the S/D structures 38 and the connection structure 40, the sixth photomask is used to pattern the passivation layer 42. However, much process cycle time and cost are required for using six photomasks to manufacture the TFT device.

SUMMARY OF THE INVENTION

The first objective of the present invention is to provide a method for manufacturing a TFT device by using four lithography steps.

The second objective of the present invention is to provide a structure of TFT device with two insulating layer for promoting the yield of the TFT device.

The third objective of the present invention is to provide a method of manufacturing the TFT devices for decreasing the cost and cycle time of the process.

A method for forming a TFT device comprises the following steps. First, a first metal layer is formed on the substrate. Then, a first insulating layer is formed on the first metal layer. A silicon layer is formed above the first insulator layer. A doped silicon layer is formed above the silicon layer. Next, a first photomask is used to define the doped silicon layer, the silicon layer, the first insulating layer, and the first metal layer. Then, a second insulating layer is formed on the doped silicon layer and the substrate, and a transparent conducting layer is formed on the second insulating layer. a second photomask is used to define the second insulating layer and the transparent conducting layer to expose a surface of the doped silicon layer. A second metal layer is formed on the transparent conducting layer and doped silicon layer, and a third photomask is used to define the second metal layer to form the S/D structures. Then, the S/D structures are used to serve as a mask for etching the doped silicon layer. Next, a passivation layer is formed on the second metal layer, the transparent conducting layer and the substrate, and a four photomask is used to define the passivation layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 3A is a top view of a transparent substrate illustrating the TFT device in accordance with the present invention; and FIG. 3B is a top view of a transparent substrate illustrating the TFT device in accordance with the present invention.

DETAILED DESCRIPTION OF THE PREFERRED EMBODIMENT

A method is disclosed hereinafter to manufacture the TFT devices by performing only four photolithography steps. Accordingly, the process cycle time and cost are decreased effectively by using the method provided in this present invention. Besides, the yields of the TFT devices are also increased. The detailed description is given as following.

Figure 1:
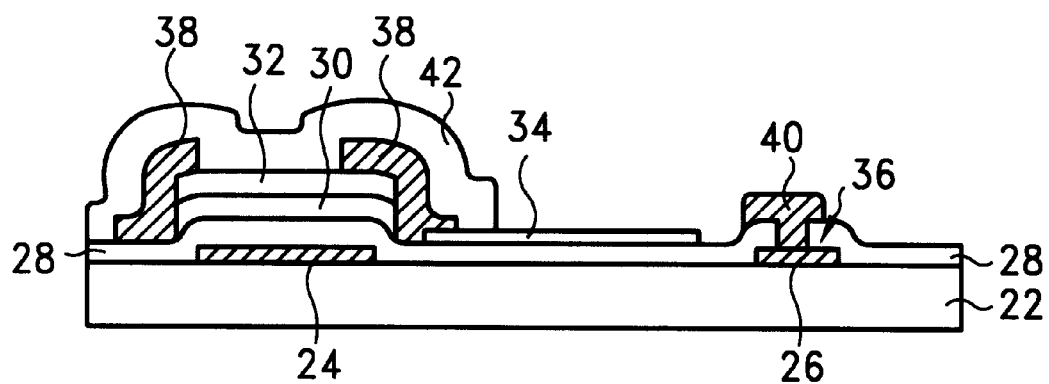
FIG. 1 is a cross sectional view of a transparent substrate illustrating the structure of TFT in accordance with the prior art.
Figure 2A:
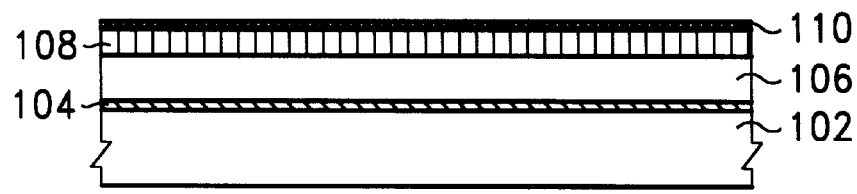
FIG. 2A is a cross sectional view of a transparent substrate illustrating the steps of forming the first metal layer, the first insulating layer, the active layer, and the contact layer in accordance with the present invention.

Refer to FIG. 2A, in a preferred embodiment, a glass, a quartz, or the like is used to be a transparent insulator substrate 102. Next, a sputtering method is used to form a first metal layer on the substrate 102. The first metal layer is used to define the gate structure. Typically, the first metal layer can be chosen from the group of chromium(Cr), tungsten(W), titanium(Ti), tantalum(Ta), molybdenum(Mo), aluminum(Al), copper(Cu) and alloy. A Cr/Al composition layer can also be used for serving as the first metal layer. Beside, in some case, a multi-gate structure can also be used for the present invention. The material of the multi-gate structure can be selected from above material. Then, a first insulating layer 106 is formed on the first metal layer 104, wherein the first insulating layer 106 can be chosen from the group of oxide, nitride, oxynitride, or other likes. In a preferred embodiment, the silicon oxide layer or the nitride layer can be formed by using plasma chemical vapor deposition (PCVD) process, and the reaction gases are $SiH_4$, $NH_3$, $N_2$, $N_2O$ or $SiH_2Cl_2$, $NH_3$, $N_2$, $N_2O$.

Next, an active layer 108 is deposited on the first insulating layer 106 to serve as the channel of TFT devices by using the well-known art, wherein the active layer 108 can be made of a-silicon. A contact layer 110 is then formed on a top surface of the active layer 108 to serve as an interface between the active layer 108 and S/D structures formed later. In an embodiment, the contact layer 110 is formed of n+ a-silicon.

Figure 2B:
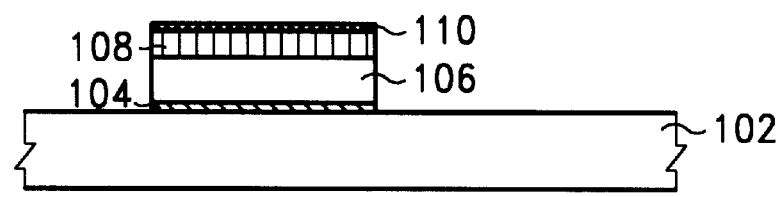
FIG. 2B is a cross sectional view of a transparent substrate illustrating the steps of etching the first metal layer, the first insulating layer, the active layer, and the contact layer in accordance with the present invention.
Figure 2C:
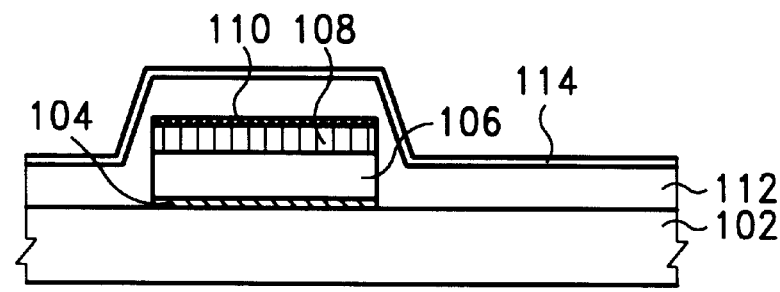
FIG. 2C is a cross sectional view of a transparent substrate illustrating the steps of forming the second insulating layer and the transparent conducting layer on the substrate in accordance with the present invention.

Please refer to FIG. 2B, a first lithography step is performed by using a first photomask in order to etch the contact layer 110, the active layer 108, the first insulating layer 106 and the first metal layer 104, for defining the gate structure 104 on the substrate 102. In a preferred embodiment, a dry etching method is used to perform the first lithography step. Refer to FIG. 2C, the second insulating layer 112 is formed above the contact layer 110 and the substrate 102, wherein the second insulating layer 112 can be chosen from the group of oxide, nitride, or other likes. In a preferred embodiment, the silicon oxide layer or the nitride layer can be formed by using plasma chemical vapor deposition (PCVD) process, and the reaction gases are $SiH_4$, $NH_3$, $N_2$, $N_2O$ or $SiH_2Cl_2$, $NH_3$, $N_2$, $N_2O$. Then, a transparent conducting layer 114 is formed on the surface of the second insulating layer 112. In a preferred embodiment, an indium tin oxide (ITO) layer with thickness about 500 to 1000 angstrom is formed at temperature about 25° C. by performing a sputtering step for serving as the transparent conducting layer 114.

Figure 2D:
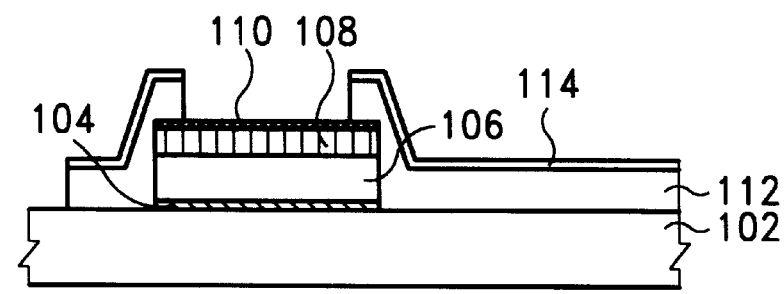
FIG. 2D is a cross sectional view of a transparent substrate illustrating the steps of etching the transparent conducting layer and the second insulating layer in accordance with the present invention.
Figure 2E:
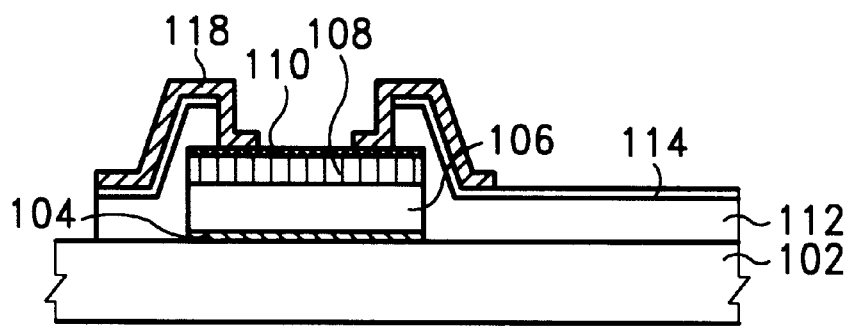
FIG. 2E is a cross sectional view of a transparent substrate illustrating the steps of defining S/D structures in accordance with the present invention.

Please refer to FIG. 2D, the second lithography step is performed by using a second photomask to etch the second insulating layer 112 and the transparent conducting layer 114 for exposing the top surface of the contact layer 110. In a preferred embodiment, the transparent conducting layer 114 is wet etched by using a mixed liquid of HCl and $HNO_3$ or a mixed liquid of HCl and $FeCl_2$. Then, refer to FIG. 2E, a second metal layer 118 is formed above the transparent conducting layer 114 and the contact layer 110. Typically, the second metal layer 118 can be chosen from the group of chromium(Cr), tungsten(W), titanium(Ti), tantalum(Ta), molybdenum(Mo), aluminum(Al), copper(Cu) and alloy. A Cr/Al composition layer can also be used for serving as the second metal layer 118. Next, the third lithography step is performed by using a third photomask to etch the second metal layer 118 for defining the source/drain (S/D) structures 118.

Figure 2F:
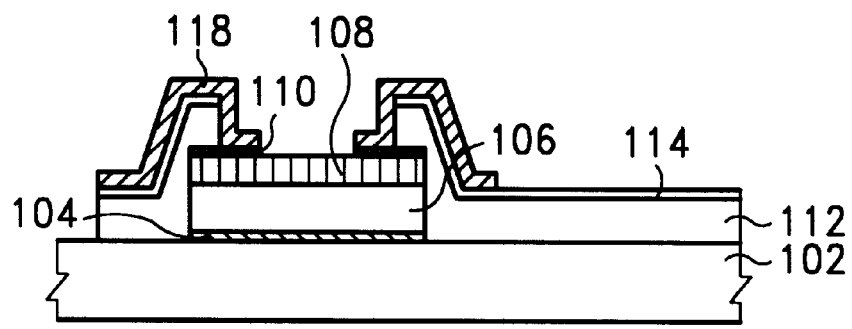
FIG. 2F is a cross sectional view of a transparent substrate illustrating the steps of etching the contact layer in accordance with the present invention.
Figure 2G:
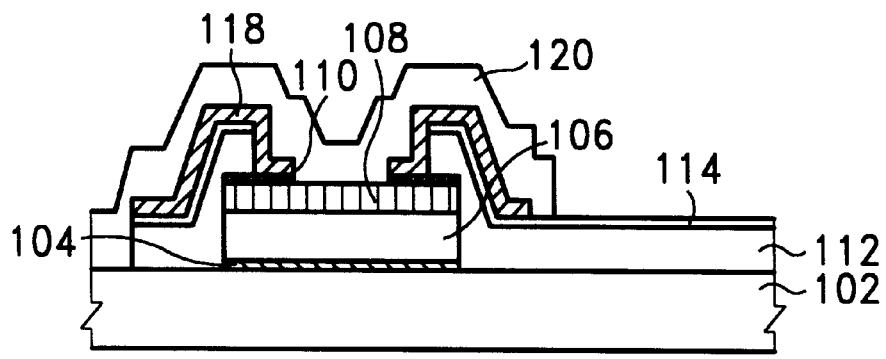
FIG. 2G is a cross sectional view of a transparent substrate illustrating the steps of forming the passivation layer in accordance with the present invention.

Then, as shown in FIG. 2F, the S/D structures 118 are used to serve as a mask for etching the contact layer 110. A passivation layer 120 is formed on the S/D structures 118, the transparent conducting layer 114, the active layer 108. The passivation layer 120 can be chosen from the group of oxide, nitride, oxynitride, or other likes. In a preferred embodiment, as known by a person of ordinary skills in the art, the silicon oxide layer or the nitride layer can be formed by using plasma chemical vapor deposition (PCVD) process, and the reaction gases are $SiH_4$, $NH_3$, $N_2$, $N_2O$ or $SiH_2Cl_2$, $NH_3$, $N_2$, $N_2O$. Then, refer to FIG. 2G, the fourth lithography step is performed by using a fourth photomask to etch and pattern the passivation layer 120. In a preferred embodiment, the etchant can be chosen from the group of $CF_4/H_2$, $CHF_3$ and $CH_3CHF_2$ when the passivation layer 120 is formed of silicon nitride.

Refer to FIG. 3A, the top view of the TFT-LCD apparatus manufactured according to the present invention is illustrated. It is noted that the gate structure 104 is also used to serve as the scan line of the TFT-LCD apparatus, and the S/D structures are also used to serve as the data lines of the TFT-LCD apparatus. Besides, the transparent conducting layer 114 and the passivation layer 120 are formed on the substrate sequentially as described above. It is noted that the parasitic transistor effect occurs among the S/D structures 118b, 118c and the region A of the scan line due to the gate structure 104 is used to serve as the scan line. Thus, the yield of the TFT-LCD apparatus will decrease because there are undesired noise occurring by the signals from the two adjacent data lines for one pixel electrode.

Please refer to FIG. 3B, another embodiment of TFT-LCD structure according to the present invention is illustrated. A protruding portion 108d adjacent to S/D structures 108b is formed in the step for defining the S/D structures 108a, wherein the protruding portion 108d is extended across the scan line between the signal lines 118a and 118c. Accordingly, the signal can be transferred to the protruding portion 108d when the signal is input to the S/D structures 108a, then the parasitic transistor effect can be avoided efficiently.

The present invention can provide various benefits. First, only four lithography steps, namely only four photomasks, are required to manufacture the TFT device by using the method provided in this invention. Thus, the complex, the cost and the cycle time of the process for forming the TFT device are lowered. In additional, all the first insulating layer, the second insulating layer, the unetched a-silicon layer and the unetched n+ a-silicon layer are used for insulating between the gate structure 104 as a scan line and the S/D structures 118 as data lines. Thus, the short-circuit effect between the gate structure (scan line) and S/D structures (data lines) due to the defects occurring in insulating layers can be avoided efficiently. Accordingly, the stability and operation performance of the TFT-LCD apparatus according to the present invention can be promoted.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a thin film transistor, said method comprises the following steps of:
   forming a first metal layer on an insulating substrate;
   forming a first insulating layer on said first metal layer;
   forming an active layer on said first insulating layer;
   forming a contact layer on said active layer;
   defining patterns of said contact layer, said active layer, said first insulating layer, and said first metal layer;
   forming a second insulating layer above said contact layer and said substrate;
   forming a transparent conducting layer above said second insulating layer;
   defining patterns of said second insulating layer and said transparent conducting layer to expose a portion of a surface of said contact layer;
   forming a second metal layer above said transparent conducting layer and said contact layer;
   defining patterns of said second metal layer to form source/drain (S/D) contact structures;
   etching said contact layer by using said second metal layer as a mask;
   forming a passivation layer on said second metal layer, said transparent conducting layer and said substrate; and
   defining patterns of said passivation layer.

2. The method of claim 1, wherein said first metal layer is selected from a group of Cr, W, Ta, Ti, Mo, Al and alloy.

3. The method of claim 1, wherein said first insulating layer is selected from a group of oxide, nitride and oxynitride.

4. The method of claim 1, wherein said active layer comprises of a-silicon.

5. The method of claim 1, wherein said contact layer comprises of doped silicon.

6. The method of claim 1, wherein said second insulating layer is selected from a group of oxide, nitride and oxynitride.

7. The method of claim 1, wherein said second metal layer is selected from a group of Cr, W, Ta, Ti, Mo, Al and alloy.

8. The method of claim 1, wherein said transparent conducting layer comprises of indium tin oxide (ITO).

9. The method of claim 1, wherein said passivation layer is selected from oxide, nitride, oxynitride, and organic material.

10. A method of forming a thin film transistor (TFT), said method comprises the following steps of:
    forming a first metal layer on an insulating substrate;
    forming a first insulating layer on said first metal layer;
    forming an a-silicon layer on said first insulating layer;
    forming a doped a-silicon layer on said a-silicon layer;
    performing a first lithography step to etch said contact layer, said a-silicon layer, said first insulating layer, and said first metal layer;
    forming a second insulating layer above said doped a-silicon layer and said substrate;
    forming an indium tin oxide (ITO) layer above said second insulating layer;
    performing a second lithography step to etch said second insulating layer and said ITO layer to expose a surface of said doped a-silicon layer;
    forming a second metal layer above said ITO layer and said doped a-silicon layer;
    performing a third lithography step to etch said second metal layer to form source/drain (S/D) structures;
    etching said doped a-silicon layer by using said second metal layer as a mask;
    forming a passivation layer on said second metal layer, said ITO layer and said substrate; and
    performing a fourth lithography step to etch said passivation layer.

11. The method of claim 10, wherein said first metal layer is selected from a group of Cr, W, Ta, Ti, Mo, Al and alloy.

12. The method of claim 10, wherein said first insulating layer is selected from a group of oxide, nitride and oxynitride.

13. The method of claim 10, wherein said second insulating layer is selected from a group of oxide, nitride and oxynitride.

14. The method of claim 10, wherein said second metal layer is selected from a group of Cr, W, Ta, Ti, Mo, Al and alloy.

* * * * *